US005287469A

United States Patent [19]
Tsuboi

[11] Patent Number: 5,287,469
[45] Date of Patent: Feb. 15, 1994

[54] ELECTRICALLY ERASABLE AND PROGRAMMABLE NON-VOLATILE MEMORY (EEPROM), WHEREIN WRITE PULSES CAN BE INTERRUPTED BY SUBSEQUENTLY RECEIVED READ REQUESTS

[75] Inventor: Toshihide Tsuboi, Tokyo, Japan

[73] Assignee: NEC Corporation, Japan

[21] Appl. No.: 457,245

[22] Filed: Dec. 27, 1989

[30] Foreign Application Priority Data

Dec. 27, 1988 [JP] Japan .................................. 63-331713

[51] Int. Cl.$^5$ ............................................. G06F 13/14
[52] U.S. Cl. ..................................... 395/425; 395/800;
364/965; 364/DIG. 2; 365/189.07
[58] Field of Search ............... 395/275, 800, 425, 725;
364/DIG. 1, DIG. 2; 365/189.05, 189.07

[56] References Cited

U.S. PATENT DOCUMENTS

| | | | |
|---|---|---|---|
| 3,961,312 | 6/1976 | Bodner et al. ........................ | 395/275 |
| 4,077,060 | 2/1978 | Bodner et al. ........................ | 395/800 |
| 4,479,179 | 10/1984 | Dinwiddie, Jr. ..................... | 395/275 |

*Primary Examiner*—Thomas C. Lee
*Assistant Examiner*—Maria N. Von Buhr
*Attorney, Agent, or Firm*—Ostrolenk, Faber, Gerb & Soffen

[57] ABSTRACT

A microcomputer having an electrically erasable and programmable nonvolatile memory into which data is written without prolonging the data write processing time, even when a data read request is issued during the data write processing operation. The microcomputer includes a data erasing/writing/reading control circuit which coordinates the writing and reading of data to and from memory. The control circuit includes a timer for counting a predetermined number of counts during the data write process corresponding to the time period required to positively write data into the memory. If a data read request occurs during the data write process, the counting of the timer is suspended while the data is read out from the memory. After the data read process is completed, the data write process is resumed, and the timer continues counting toward the predetermined count from the count at which it was suspended. When the timer reaches the predetermined count, the data has been positively written into memory, and the data write process is terminated.

5 Claims, 6 Drawing Sheets

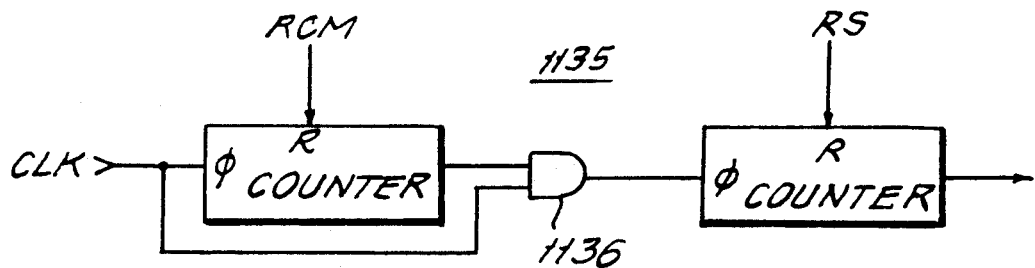
FIG. 5.
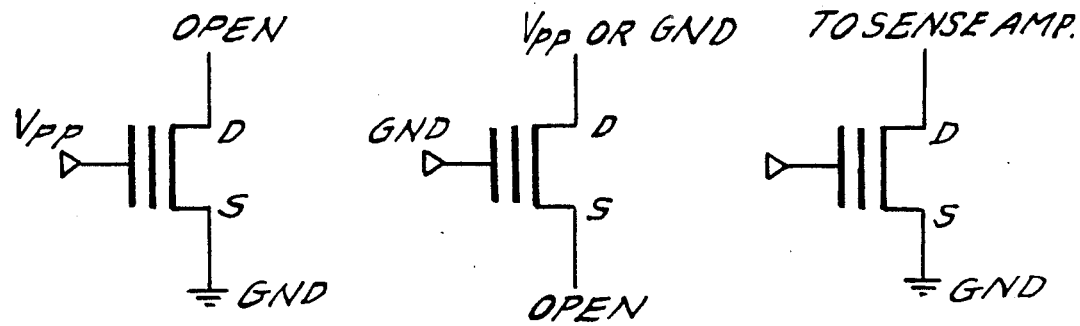
FIG. 7A ERASE
FIG. 7C READ
FIG. 7B WRITE
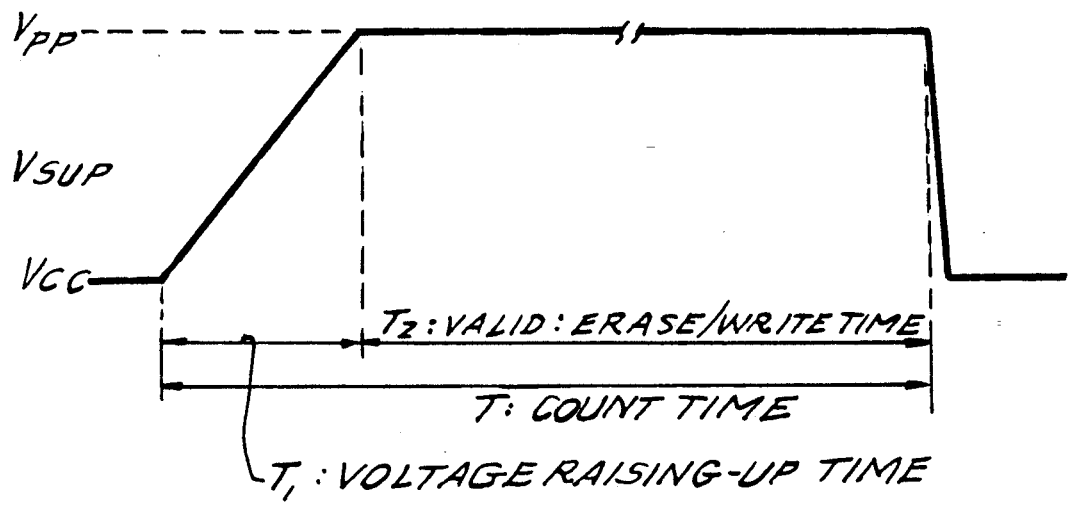
FIG. 8.

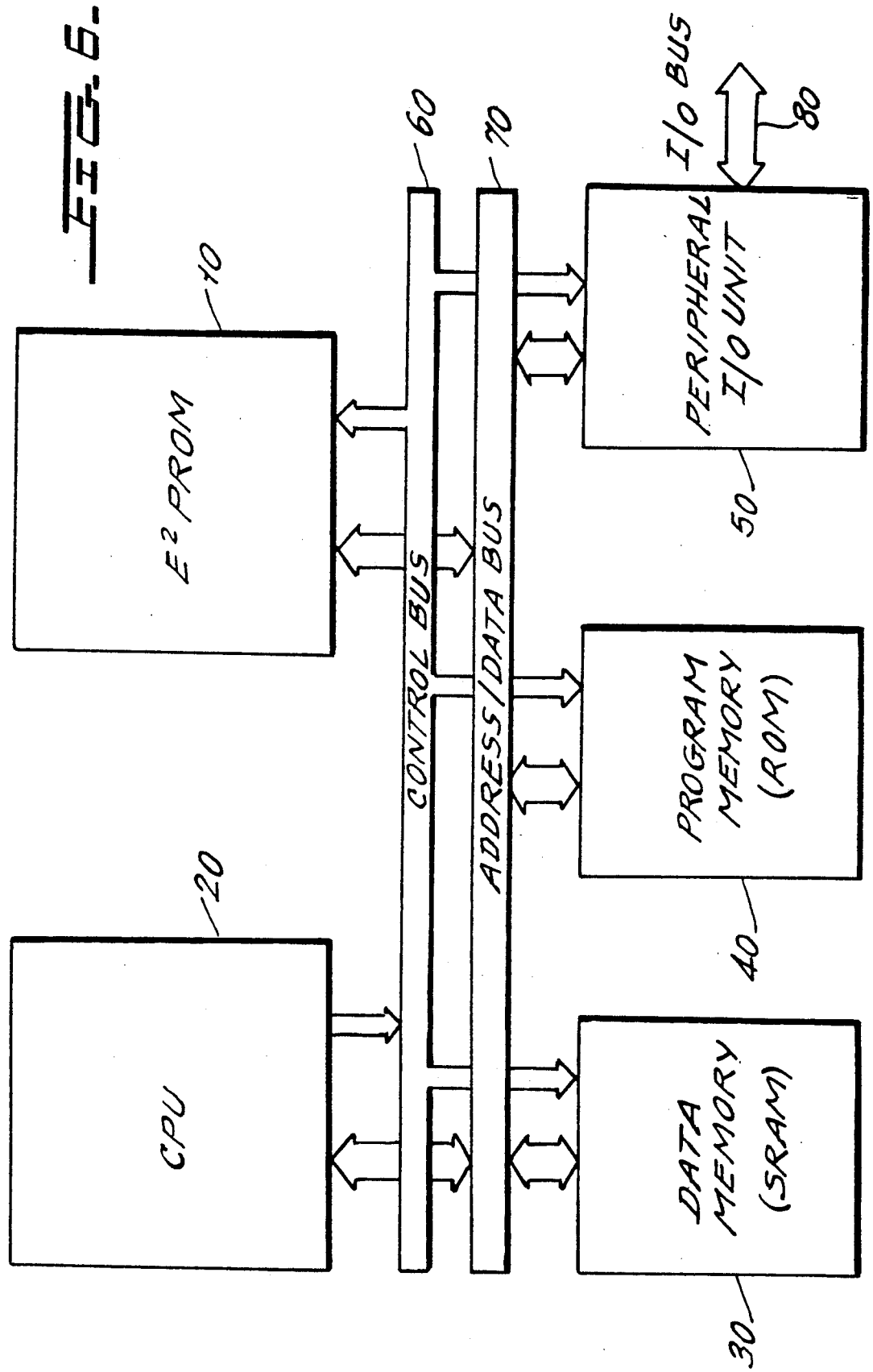

ELECTRICALLY ERASABLE AND PROGRAMMABLE NON-VOLATILE MEMORY (EEPROM), WHEREIN WRITE PULSES CAN BE INTERRUPTED BY SUBSEQUENTLY RECEIVED READ REQUESTS

BACKGROUND OF THE INVENTION

The present invention relates to a microcomputer and, more particularly, to a microcomputer having an electrically erasable and programmable nonvolatile memory (called hereinafter "E²PROM") as a data memory.

A random access memory (RAM) is generally employed as a data memory of a microcomputer, which stores data to be processed and processed resultant data. However, a RAM has an unavoidable problem that data stored therein are destroyed when a power voltage supplied thereto is cut off. Therefore, an E²PROM is typically employed as a part of the data memory to store and hold data which are required to be kept stored even after a power voltage is cut off.

A data write process to an E²PROM consists of an erasing operation, which is first performed to initialize the memory cell at an address to be written with new data by erasing the data formerly stored at that address, and a writing operation, which is subsequently performed to write the new data into that address. As is well known in the art, the erasing and writing operations require a relatively long time duration, about 10 msec, respectively. This time duration is extremely long in comparison with an instruction execution time or a machine cycle time of a CPU (Central Processing Unit). If a CPU is programmed to perform the data write process to E²PROM, the execution efficiency of the program is deteriorated substantially.

In order to solve this problem, an erasing and writing automation circuit is provided to control the data write process to an E²PROM in place of a CPU. When the CPU receives a data write instruction to the E²PROM, it issues the automation circuit with a data write request including a write address, data to be written (i.e., write data) and a write command signal. The CPU is thereafter shifted to a subsequent operation to execute other instructions.

On the other hand, the erasing and writing automation circuit is initiated by the data write request to first perform the erasing operation in which a so-called $V_{pp}$ voltage higher than a power voltage applied to the CPU is applied to memory cells of the selected address of the E²PROM for the above-mentioned relatively long period. The data, which have been stored in those memory cells, are thereby erased. When the erasing operation is completed, the writing operation is performed to apply the Vpp voltage or ground voltage to the selected memory cells in accordance with data to be written for the relatively long period. The new data is thereby stored in the selected memory cells. In order to detect each of the erasing and writing operation time durations, the automation circuit includes a timer for counting a reference clock signal and generating an operation end signal when a predetermined time has elapsed. In response to this operation end signal, the application of the Vpp voltage to the selected memory cells is terminated to thereby complete the erasing and writing operations.

Since the CPU executes subsequent instructions in parallel to the data write process, by the automation circuit, a situation will occur in which the CPU encounters a data read instruction for reading data from the E²PROM. Since the data read operation for reading data from the E²PROM can be performed at a high speed, similarly to the data read operation from RAM, the data read instruction for reading data from E²PROM is executed immediately without waiting until the current data write process to E²PROM is completed. When the CPU executes the data read instruction for reading out from the E²PROM, it issues the automation circuit with a data read request including read address information and a read command; signal. In response to this request, the automation circuit suspends the data write process and then brings the E²PROM into a data read operation mode. An address of the E²PROM selected by the read address information is accessed and data stored therein is then transferred to the CPU. The suspended data write process is thereafter resumed.

Thus, the data write process may be temporarily suspended by the data read request issued from the CPU. However, the automation circuit automatically completes the erasing and writing operations in response to the operation end signal generated by the timer. For this reason, the application time of the Vpp voltage to the selected memory cells is shortened by the suspended time of the data write process. The data is thereby not fully written into the E²PROM. This drawback can be solved by initializing or resetting the timer in response to the data read request. However, in that case, the data write process is again performed from the beginning, so that a time for preforming the data write process is prolonged undesirably.

SUMMARY OF THE INVENTION

Therefore, an object of the present invention is to provide a microcomputer including an E²PROM equipped with an improved data erasing, writing and read control circuit Another object of the present invention is to provide a microcomputer having an E²PROM into which data is positively written without prolonging a data write processing time.

Still another object of the present invention is to provide an E²PROM equipped with a control circuit which performs a data write process to positively write data into selected memory cells without prolonging the processing time even when a data read request is issued during the data write processing operation.

The microcomputer of the present invention comprises an E²PROM, CPU executing a program and issuing a data write request and a data read request to the E²PROM, and a data erasing/writing/reading control circuit including a timer for counting a time to generate a processing end signal when a predetermined time has elapsed, a data write process control circuit responding to the data write request to perform a data write process in which data stored in a selected memory cell of the E²PROM is first erased and new data is then written into the selected memory cell and for responding to the processing end signal to terminate the data write process, a data read control circuit responding to the data read request issued during the data write process to suspend the data write process, read out data from a selected memory cell and resume the suspended data write process, and a timer control circuit for suspending the time counting operation of the timer during the suspended period of the data write process.

Thus, if the data write process is suspended, the counting of the timer is suspended, not initialized or reset. This is based upon the fact that while the Vpp voltage has to be applied to the memory cell for a preselected time in order to erase data thereof and write new data thereinto, the Vpp voltage does not have to be applied continuously over the preselected time; rather, it is only the total application time of the Vpp voltage which must satisfy the preselected time., For example, if the preselected time for applying the Vpp voltage is 10 msec, the Vpp voltage can be applied five times of 2 msec each.

As a result, even if the data write process is suspended by the data read request, the data is positively written into the selected memory cell of the E²PROM without prolonging the data write processing time.

BRIEF DESCRIPTION OF THE DRAWINGS

The above and other objects, advantages and features of the present invention will be more apparent from the following description taken in conjunction with the accompanying drawings, in which

FIG. 5 is a block diagram representative of another embodiment of the timer shown in FIG. 2;

FIG. 6 is block diagram representative of a microcomputer employing the E²PROM shown in FIG. 1;

FIGS. 7A, 7B and 7C are equivalent circuits of one E²PROM memory cell in an erasing mode, a write mode and a reading mode, respectively; and FIG. 8 is a waveform diagram representative of an output voltage of a charge-pumping circuit shown in FIG. 2.

DETAILED DESCRIPTION OF THE INVENTION

Figure 1:
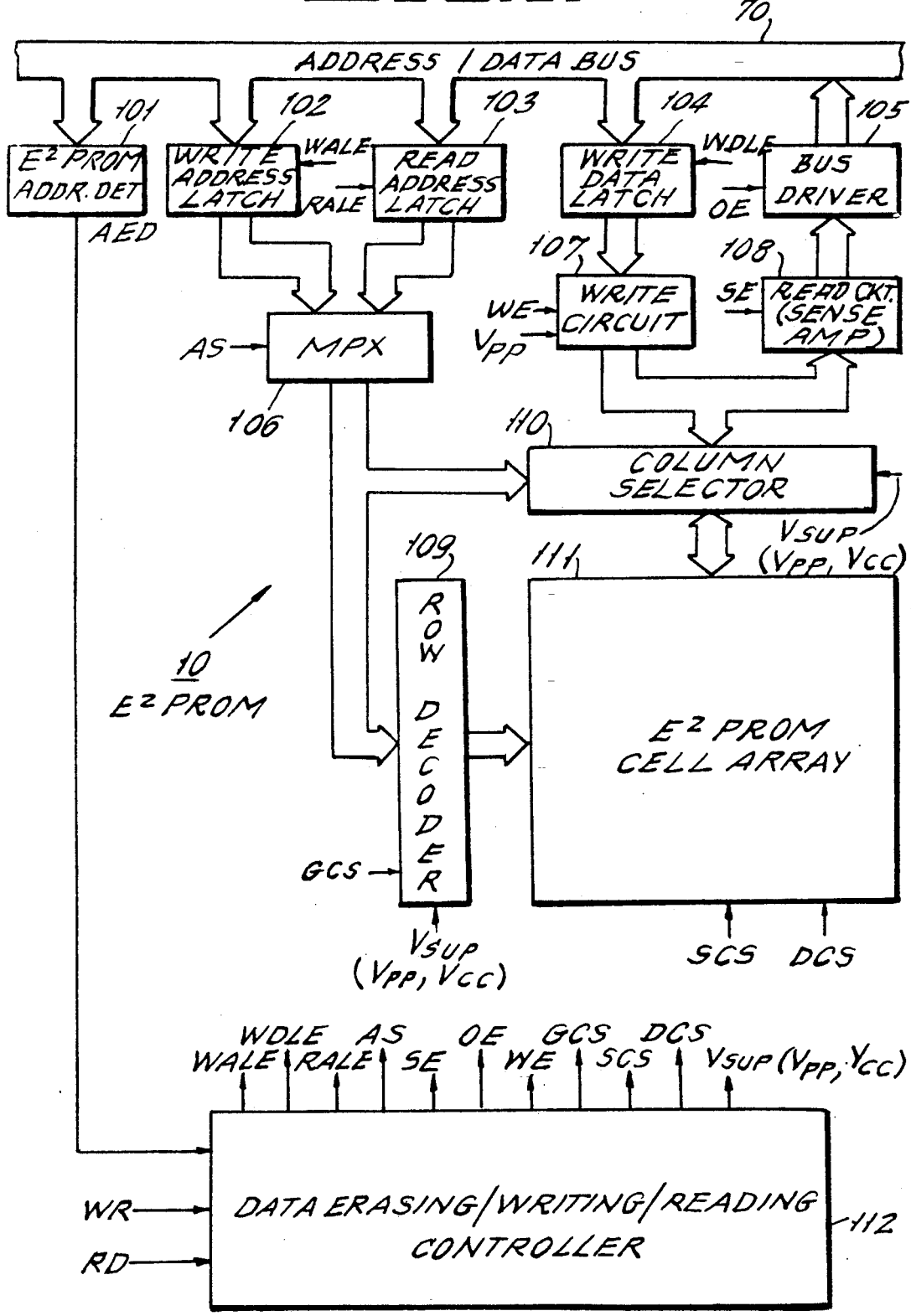
FIG. 1 is a block diagram representative of an E²PROM according to an embodiment of the present invention.

Referring to FIG. 1, E²PROM 10 according to an embodiment of the present invention is coupled to an address/data multiplex bus 70.

Referring to FIG. 6, the bus 70 is in turn coupled to CPU 20. Further coupled to the bus 70 are a data memory 30 constituted of a static type RAM (SRAM), a program memory 40 constituted of a mask ROM, and a peripheral I/O unit 50 including an A/D converter, a serial interface unit, a timer counter and so forth, all not shown. Unit 50 is also coupled through an I/O bus 80 to controlled devices (not shown). The respective units 10 to 50 are further interconnected via a control bus 60. CPU 20 reads out each instruction from the program memory 40 and by executing it, performs arithmetic and/or logic operation on operand data. CPU 20 further performs data read and write operations to E²PROM 10, data memory 30 and I/O unit 50.

Turning back to FIG. 1, E²PROM 10 includes an E²PROM address detector 101, a write address latch circuit 102, a read address latch circuit 103, a write data latch circuit 104 and a bus driver 105, all of which are connected to the bus 70. The address detector 101 detects whether or not the address information on the bus 70 exists in a memory space allocated to E²PROM 10 and generates a high level address detection signal AED when the address information is detected to exist in the memory space. In the present embodiment, E²PROM 10 is allocated to a memory space from "500H" to "8FFH" and thus has a memory capacity of 1K byte. The mark "H" represents a hexadecimal notation. The detector 101 decodes the four most significant bits of the address information on the bus 70 and generates the high level signal AED when the content of those four bits is "5H", "6H", "7H" or "8H". The latch circuit 102 latches the information on the bus 70 as a write address in response to a write address latch enable signal WALE supplied thereto, and the latch circuit 103 latches the information on the bus as a read address in response to a read address latch enable signal RALE. The latch circuit 104 latches the information on the bus 70 as data to be written (i.e., write data) in response to a write data latch enable signal WDLE. The output address of the latch circuits 102 and 103 are supplied to a multiplexer (MPX) 106 controlled by an address selection signal AS. MPX 106 selects the output address of the latch circuit 102 when the signal AS assumes a low level and selects the output address of the latch circuit 103 when the signal AS assumes a high level. A part of the address selected by MPX 106 is supplied to a row decoder 109 as a row address and the remaining part thereof is supplied to a column selector 110 as a column address An E²PROM cell array 111 includes a number of E²PROM memory cells arranged in rows and columns. A predetermined number of memory cells are selected by the row decoder 109 and the column selector 110. In a data read operation, data stored in the selected memory cells are read out therefrom and amplified by a read-out circuit (sense amplifier) 108 responsive to a sense-enable signal SE. The read-out data are then transferred onto the bus 70 via the bus driver 105 in response to an output-enable signal OE.

In this embodiment, each of the memory cells consists of an insulated gate field effect transistor having a floating gate, as shown in FIG. 7. The data erasing operation of the cell is performed with source S being grounded, drain D being opened and control gate being applied with Vpp voltage, as shown in FIG. 7A. The data writing operation of the cell is performed with the source being opened, the control gate being grounded and the drain being applied with Vpp voltage or ground voltage from a write circuit 107 (FIG. 1) in accordance with data to be written, as shown in FIG. 7B. The data reading operation of the cell is performed with the source being grounded and the control gate being applied with a read-out voltage $V_{RD}$, and drain is coupled to the sense amplifier 108 via the column selector 110, as shown in FIG. 7c. Thus, in response to the respective operations, the voltage states of the source, drain and control gates of the selected memory cell are controlled.

Turning back again to FIG. 1, the E²PROM cell array 111 is supplied with a source control signal SCS and a drain control signal DCS. The high level of the signal SCS grounds the source of the selected memory cell and the low level thereof opens it. The high level of the signal DCS coupled to the drain of the selected memory cell to the sense amplifier 108 and the write circuit 107 via the column selector 110 and the low level thereof opens it. The write circuit 107 is activated by a write-enable signal WE and then applies Vpp voltage or ground voltage to the drain of the selected memory cell in accordance with the data to be written from the latch circuit 104. A gate control signal GCS is supplied to the row decoder 109 which further receives an energizing voltage $V_{sup}$, taking Vpp level in the erasing and writing operation and taking a power voltage level Vcc in the read operation, the power voltage Vcc being applied to E²PROM 10. When the signal GCS assumes a high level, the row decoder 109 applies Vpp voltage to control gate of the selected memory in the erasing operation and supplies the read-out voltage $V_{RD}$ thereto in the reading operation. On the other hand, the low level of the signal GCS grounds the control gate of the selected memory cell. The energizing voltage Vsup is further supplied to the column selector 110. The above-mentioned control signals and energizing voltage are generated by a data erasing/writing/reading control circuit 112. This circuit 112 operates in predetermined sequence in response to the signal AED from the address detector 101 and write and read command signals WR and RD supplied via the control bus 60 from CPU 20.

Figure 2:
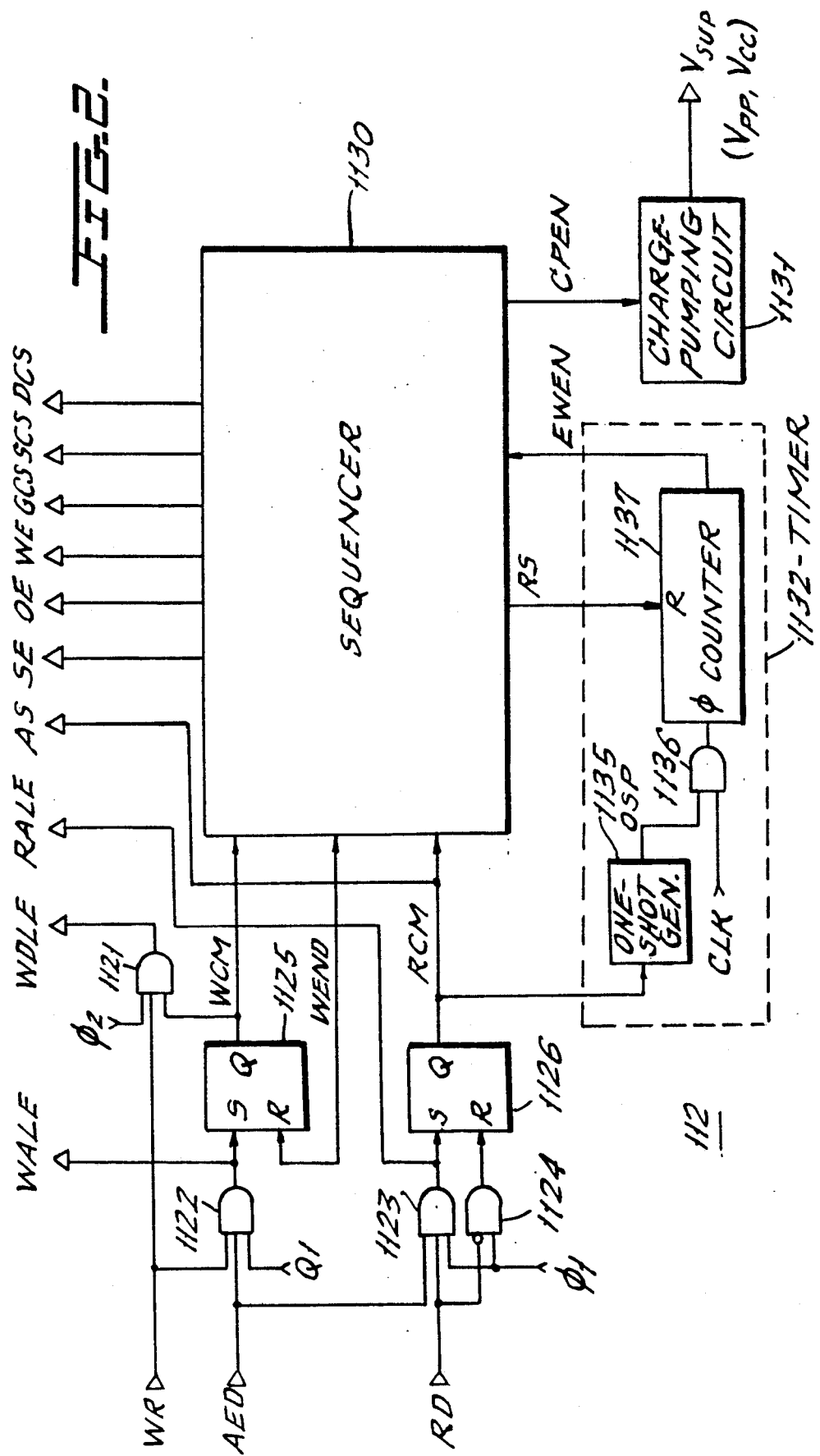
FIG. 2 is a block diagram representative of the erasing/writing/reading control circuit shown in FIG. 1.
Figure 3:
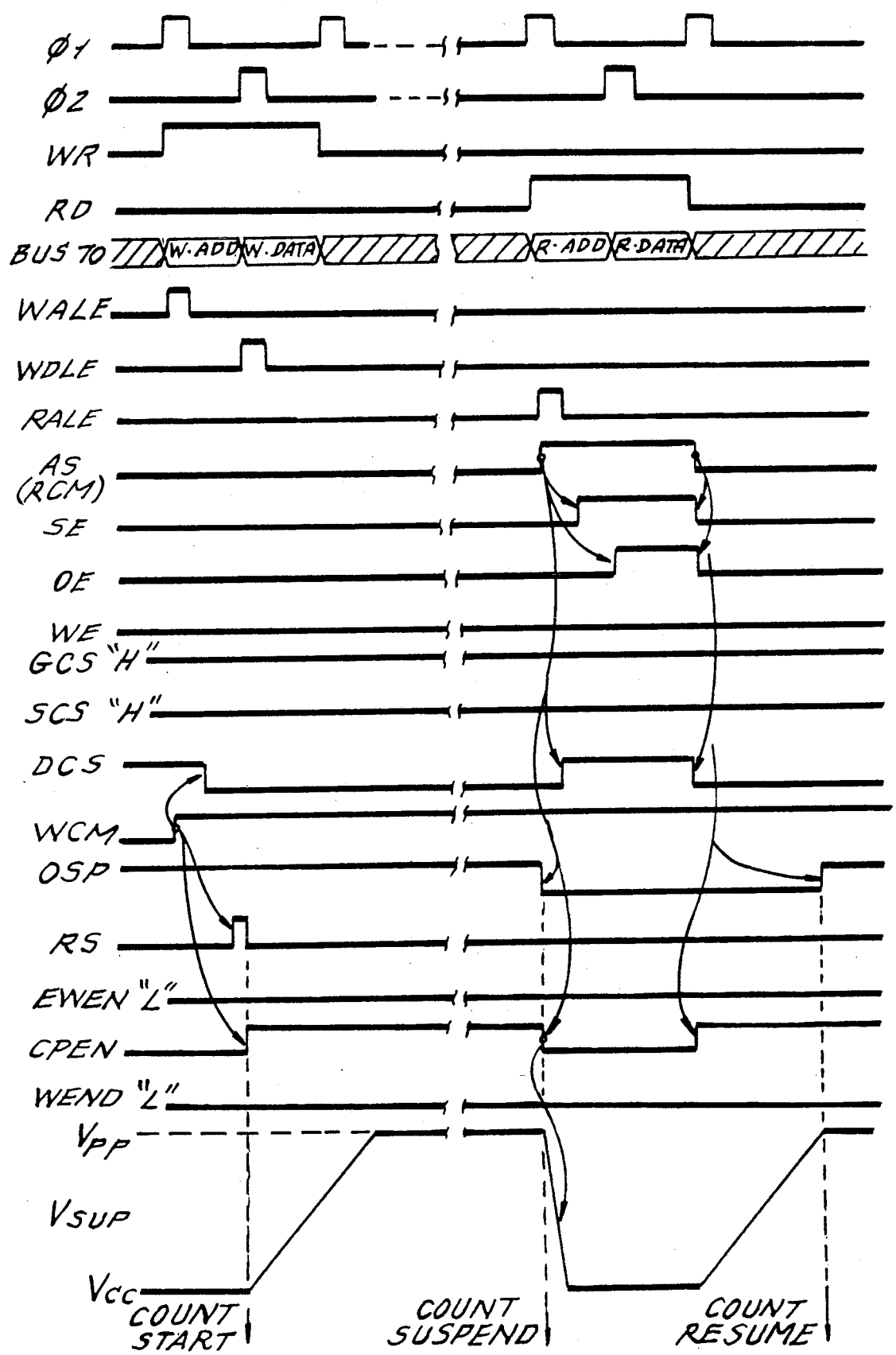
FIGS. 3 and 4 are timing charts representative of the operation of E²PROM shown in FIG. 1.

Referring to FIG. 2, the control circuit 112 includes four AND gates 1121 to 1124, two S-R type flip-flops (F/Fs) 1125 and 1126, a sequencer 1130, a charge-pumping circuit 1131 and a timer 1132. This timer 1132 includes a one-shot pulse generator 1135, an AND gate 1136 and a counter 1137. The AND gate 1122 responds to the write command signal WR, the address detection signal AED and a first CPU machine cycle control signal $\phi 1$ to generate the write address latch enable signal WALE F/F 1125 is set by the signal WALE to inform the sequencer of the data write request from CPU 20 via a write request signal WCM. The AND gate 1121 responds to the signals WR and WCM and a second CPU machine cycle control signal $\phi 2$ to generate the write data latch enable signal WDLE. F/F 1125 is reset by a data write process end signal WEND from the sequencer 1130. The AND gate 1123 responds to the read command signal RD, the address detection signal AED and the first machine control signal $\phi 1$ to generate the read address latch enable signal RALE. F/F 1126 is set by the signal RALE to inform the sequencer 1130 of the data read request from CPU 20 via a read request signal RCM. This signal RCM is also supplied to MPX 106 as the address selection signal AS. The AND gate 1124 detects a data read bus cycle by the inverted signal $\overline{RD}$ and the signal $\phi 1$ and resets F/F 1126. The sequencer 1130 responds to the write request signal WCM, read request signal RCM and operation end signal EWEN from the timer 1132 to generate the above control signals SE, OE, WE, GCS, SCS and DCS in accordance with predetermined sequence. The sequencer 1130 can be readily formed of various gate circuits and/or a PLA (programmable logic array) circuit with reference to timing charts shown in FIGS. 3 and 4 which will be described later. The sequencer 1130 further generates a charge-pumping enable signal CPEN to the charge-pumping circuit 1131. As well known in the art, this circuit 1131 has capacitors and transistor switches and boosts the Vcc voltage up to Vpp level in response to a boosting clock signal (not shown) and the active level of the signal CPEN. The inactive level of CPEN clamps the energizing voltage Vsup at Vcc level. Thus, since the charge-pumping circuit 1131 boosts Vcc voltage up to Vpp voltage, the energizing voltage Vsup reaches Vpp level from Vcc level after a voltage raising-up time has elapsed, as shown by "$T_1$" in FIG. 8. When the voltage Vsup reaches Vpp level, the valid or substantial erasing/writing operation starts. After Vpp level is applied to the selected memory cell during a time $T_2$ shown in FIG. 8, the erasing/writing operation is terminated. The sum of these times $T_1$ and $T_2$ is a preset time T of the timer 1132. The timer 1132 detects the preset time T by counting a reference clock signal CLK by means of the counter 1137 and generates the operation end signal EWEN. The AND gate 1136 is inserted into the supply line of clock signal CLK Accordingly, the counter 1137 counts the clock signal CLK during the open state of the gate 1136 The open and closed states of the gate 1136 are controlled by a one-shot pulse signal OSP from the generator 1135. When F/F 1126 is set, i.e. when the data read request is issued, the generator 1135 changes the signal OSP to the low level during the predetermined time period to close the AND gate 1136. The generator 1135 may be formed of a CR time constant circuit and an inverter The operation of the invention will now be described below with reference also to FIGS. 3 and 4.

When CPU 20 executes a data write instruction to E²PROM 10, it generates the write command signal WR and transfers a write address onto the bus 70 in synchronism with the first machine cycle control signal $\phi 1$. CPU 20 thereafter transfers data to be written (write data) onto the bus 70 in synchronism with the second machine cycle control signal $\phi 2$. In response thereto, the AND gate generates the latch enable signal WALE, so that the latch circuit 102 latches the write address Further, since the latch signal WDLE is generated by the AND gate 1121, the latch circuit 104 latches the write data. Since the signal AS assumes the low level, MPX 106 supplies the write address from the latch circuit 102 to the row decoder 109 and column selector 110. F/F 1125 is set by the signal WALE to change the write request signal WCM to the high level. In response thereto, the sequencer 1130 changes the drain control signal DCS to the low level to open drain of each of the selected memory cells. The signals GCS and SCS are held at the high level. The sequencer 1130 further generates a reset pulse RS to reset the counter 1137 and changes the charge-pumping enable signal CPEN to the active, high, level. The counter 1137 starts to count the clock signal CLK. The charge-pumping circuit 1131 starts the boosting operation. After the time $T_1$ is elapsed, the energizing voltage Vsup of Vpp level is supplied to the row decoder 109, which is turn supplies Vpp level to the control gate of each selected memory cell having its source grounded and drain opened. The erasing operation thus starts.

CPU 20, after issuing the data write request to E²PROM 10, reads out each of subsequent instructions from the program memory 40 and executes it. Therefore, CPU 20 may encounter a data read instruction from E²PROM 10. When CPU 20 encounters such an instruction, it generates the read command signal RD and transfers a read address onto the bus 70 in synchronism with the signal $\phi 1$. In response thereto, the AND gate 1123 generates the latch enable signal RALE, so that the read address is latched into the latch circuit 103 F/F 1126 is set by the signal RALE to change the signal AS (RCM) to the high level. MPX 106 selects the latch circuit 103 to supply the read address to the row decoder 109 and column selector 110. In response to the high level read request signal RCM, the sequencer 1130 changes the signal CPEN to the low level The charge-pumping circuit 1131 is thereby deactivated and the energizing voltage Vsup is clamped, at Vcc level. The sequencer 1130 further changes the signal DCS to a high level and then changes the signal SE to a high level to activate the sense amplifier 108. The sequencer 1130 thereafter changes the signal OE to a high level in synchronism with φ2. The bus driver 105 is thereby activated, so that data stored in memory cells selected by the read address are transferred onto the bus 70. In response to the high level read request signal RCM, the generator 1135 changes the signal OSP to a low level. As a result, the AND gate 1136 is closed and the counter 1137 suspend its counting of the clock signal CLK.

CPU 20 inverts the read command signal RD to the low level in synchronism with φ1, so that F/F 1126 is reset. AS (RCM) signal is thereby changed to a low level. In response to the low level AS signal,, MPX 106 selects the latch circuit 102. In response to the low level PCM signal, the sequencer 1130 inverts SE, OE and DCS signals to a low level and further inverts CPEN signal to a high level. Therefore, the charge-pumping circuit 1131 starts the boosting operation and boosts the voltage Vsup up to Vpp level after the time $T_1$.

It should be noted that the OSP signal is held at a low level even after the read request signal RCM is changed to a low level. As described above, the charge-pumping circuit 1131 boosts the voltage Vsup up to Vpp level after $T_1$ time has elapsed. During this time $T_1$, the valid or substantial data erasing is not performed. In order to prevent the counter 1137 from advancing the count value thereof, the signal OSP is held at a low level. At a point in time corresponding to the time at which the voltage Vsup reaches Vpp level, the generator 1135 changes the OSP signal to a high level. The counter 1137 thereby resumes counting the clock signal CLK. Since the voltage rise time $T_1$ depends on the circuit construction of the charge-pumping circuit 1131 and since the data read bus cycle period is determined by φ1 and φ2, the low level period of the OSP signal can be easily determined.

Thus, if the data write process is suspended by the data read request, the time count operation of the timer 1132 is also suspended during the period corresponding to the sum of the data read cycle period and the voltage rise time $T_1$.

Figure 4:
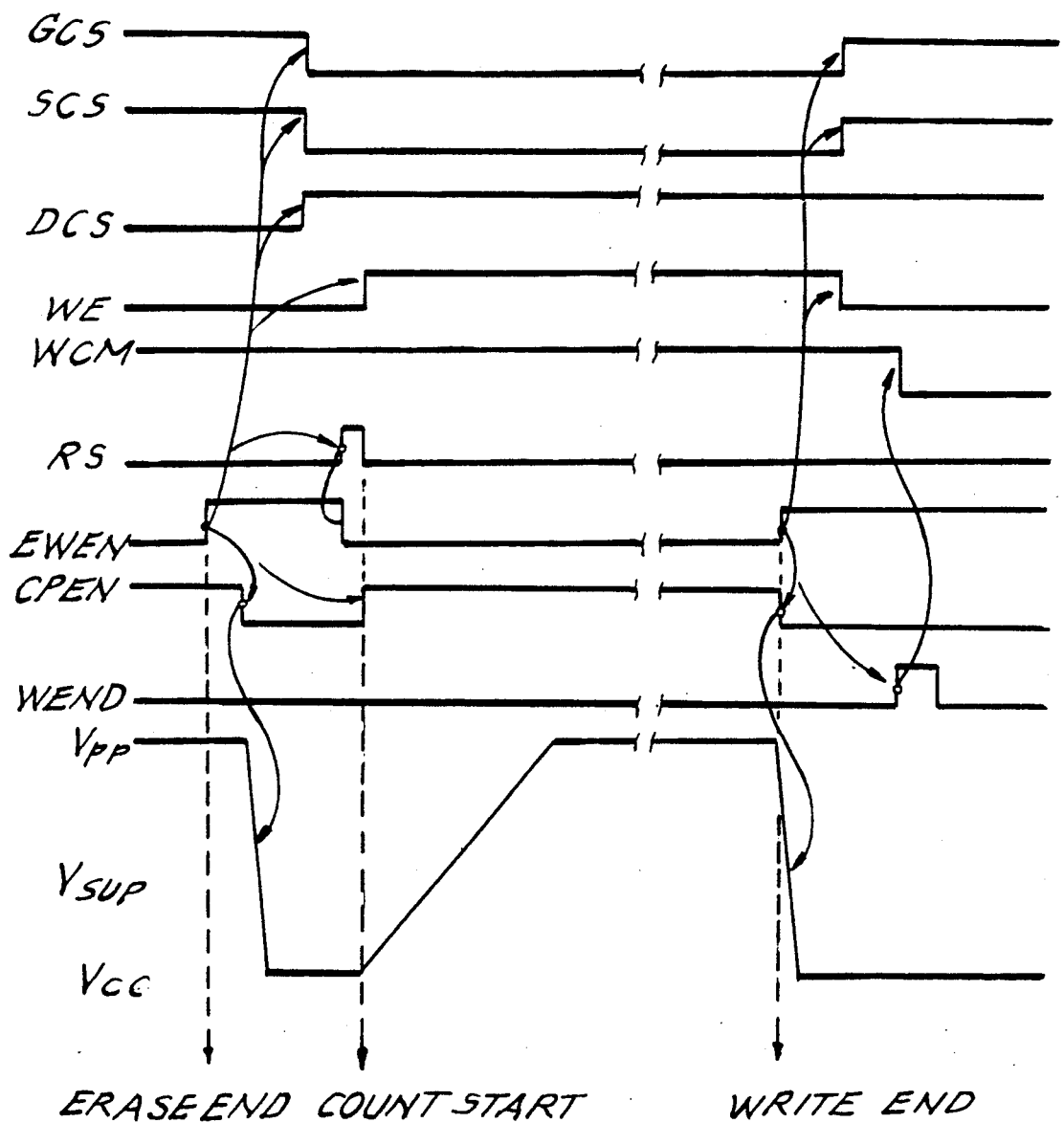

The counter 1137 advances to count the clock signal CLK and, when the time $T_2$ required to erase data has been elapsed, the timer 1132 generates the erasing end signal EWEN, as shown in FIG. 4. In response thereto, the sequencer 1130 produces the low level CPEN signal to clamp the voltage Vsup at Vcc level and then changes GCS, SCS and DCS signals to the low level, low level and high level, respectively. Thereafter, the sequencer 1130 produces the pulse RS to reset the counter and then changes CPEN and WE signals to the high level. The write circuit 107 is thereby activated. Thus, the writing operation starts. The counter 1137 starts to count the clock signal CLK.

When the time T has elapsed, the timer 1132 produces the writing end signal EWEN In response thereto, the sequencer 1130 inverts the CPEN signal to a low level and then changes GCS, SCS and WE signals to a high level, high level and low level, respectively. The data write processing end signal WEND is thereafter generated to reset F/F 1125. Thus, the data write process responsive to the data write request is completed. When CPU 20 issues the data read request during the writing operation, the writing operation is suspended and the data is then read out of the selected address, the suspended writing operation being thereafter resumed, similarly to FIG. 3. At this time, the counter 1137 also suspends the count operation during the period corresponding to the sum of the read bus cycle period and the voltage rise time $T_1$.

Referring to FIG. 5, a timer 1132' according to another embodiment includes a counter 1138 in place of the one-shot pulse generator 1135 shown in FIG. 2. This counter 1138 is reset by the high level RCM signal. In response to the change of the RCM signal to a low level, the counter 1138 starts to count the clock pulse CLK and generates a high level overflow signal after the time $T_1$ elapses. The AND gate 1136 is thereby opened. The high level overflow signal is held until the next high level RCM signal is applied to the counter 1138.

The present invention is not limited to the above embodiments, but may be changed and modified without departing from the scope and spirit of the invention.

What is claimed is:

1. A microcomputer comprising an electrically erasable and programmable nonvolatile memory, a central processing unit for executing a program and issuing a data write request and a data read request to said nonvolatile memory, said data write request including a write address and write data and said read request including a read address, and a control circuit coupled to said nonvolatile memory and said central processing unit, said control circuit including timer means for preforming a time-counting operation to generate an operation end signal, first means responsive to said data write request for performing a data write process in which data stored in a first memory cell of said nonvolatile memory designated by said write address is first erased by applying a high voltage and said write data is then written in said first memory cell by applying said high voltage, second means responsive to said operation end signal for causing said first means to terminate said data write process, third means responsive to said data read request issued while said first means is applying said high voltage to said first memory cell in said data write process, for commanding said first means to stop applying said high voltage to said first memory cell to suspend said data write process, for reading out data from a second memory cell of said nonvolatile memory designated by said read address and thereafter for allowing said first means to reapply said high voltage to resume the suspended data write process and fourth means for commanding said timer means to suspend said time-counting operation in response to said data read request issued while said first means is applying said high voltage to said first memory cell in said data write process and for allowing said timer means to resume said time-counting operation after said third means reads out data from said second memory cell, said timer means thereby delaying the generation of said operation end signal.

2. The microcomputer as claimed in claim 1, wherein said microcomputer further comprises a terminal supplied with a power voltage and said first means includes booster means for boosting, when activated, said power voltage and for generating said high voltage after a predetermined period of time, said booster means being deactivated when said first means is commanded to suspend said data write process and being reactivated when said first means is allowed to resume said suspended data write process, and said further means continuing to command said timer means to suspend said time-counting operation until said booster means generates said high voltage based upon the reactivation thereof even after said third means reads out data from said second memory cell.

3. An electrically erasable and programmable nonvolatile memory for a microcomputer issuing a data write request and a data read request to said memory, said data write request including a write address and said data read request including a read address, said memory comprising a memory cell array, timer means for carrying out a time-counting operation to generate an end signal when a predetermined time elapses, performing means responsive to said data write request for performing a data writing operation by keeping a high voltage applied to a first memory cell designated by said write address until said timer means generates said end signal, means responsive to said data read request issued while said high voltage is being applied to said first memory cell in said data writing operation for commanding said performing means to stop applying said high voltage to suspend said data writing operation irrespective of said timer means not generating said end signal, means for reading out data from a second memory cell designated by said read address while said performing means is suspending said data write operation, means for allowing said performing means to reapply said high voltage to resume the suspended data writing operation after said data is read out from said second memory cell, and means for commanding said timer means to suspend said time-counting operation operation in response to said read data request issued while said high voltage is being applied to said first memory cell in said data writing operation and for allowing said timer means to resume the suspended time-counting operation after said data is read out from said second memory cell, said timer means thereby delaying generation of said end signal.

4. A method of reading and writing data from and into an electrically erasable programmable nonvolatile memory, comprising the steps of:

performing, in response to a data write request including a write address and write data, a time-counting operation to generate a first end signal after a first period of time and further to generate a second end signal after a second period of time from the generation of said first end signal;

selecting, in response to said data write request, a first memory cell of said nonvolatile memory designated by said write address;

applying a high voltage continuously to said first memory cell until said first end signal is generated to erase data stored in said first memory cell and thereafter applying said high voltage again continuously to said first memory cell until said second end signal is generated to write said write data into said first memory cell;

suspending, in response to a data read request including a read address, application of said high voltage to said first memory cell even upon non-receipt of a corresponding one of said first and second end signals;

suspending, in response to said read request, said time-counting operation to delay the generation of said corresponding one of said first and second end signals;

selecting a second memory cell of said nonvolatile memory, designated by said read address while application of said high voltage is being suspended;

reading out data from said second memory cell;

resuming said time-counting operation after said data is read out from said second memory cell; and resuming applying said high voltage to said first memory cell after said data is read out from said second memory cell.

5. The method as claimed in claim 4, wherein said method further comprises the step of boosting a power voltage supplied to said nonvolatile memory to generate said high voltage, and said step of resuming said time-counting operation resumes said time-counting operation after said data is read out from said second memory cell and said high voltage is generated.

* * * * *